US005887117A

United States Patent [19]
Desu et al.

[11] Patent Number: 5,887,117
[45] Date of Patent: Mar. 23, 1999

[54] FLASH EVAPORATOR

[75] Inventors: Seshu Babu Desu; Sasangan Ramanathan; Carlos Tres Avala Suchicital, all of Blacksburg, Va.

[73] Assignees: Sharp Kabushiki Kaisha, Osaka, Japan; Virginia Tech Intellectual Properties, Inc., Blacksburg, Va.

[21] Appl. No.: 778,048

[22] Filed: Jan. 2, 1997

[51] Int. Cl.[6] .............................. A01G 13/06; B01D 3/06
[52] U.S. Cl. ............................................ 392/386; 392/399
[58] Field of Search ..................................... 392/386, 399, 392/394, 485, 341; 239/138, 137, 14.1

[56] References Cited

U.S. PATENT DOCUMENTS

| 522,718 | 7/1894 | Leonard | 219/540 |
|---|---|---|---|
| 2,219,522 | 4/1940 | Hinsch | 48/211 |
| 5,224,202 | 6/1993 | Arnold et al. | 392/522 |

*Primary Examiner*—John A. Jeffery
*Assistant Examiner*—Vinod D Patel
*Attorney, Agent, or Firm*—Gibson, Dunn & Crutcher LLP

[57] ABSTRACT

A device and method for flash evaporating a reagent includes an evaporation chamber that houses a dome on which evaporation occurs. The dome is solid and of high thermal conductivity and mass, and may be heated to a temperature sufficient to vaporize a specific reagent. The reagent is supplied from an external source to the dome through a nozzle, and may be supplied as a continuous stream, as a shower, and as discrete drops. A carrier gas may be introduced into the evaporation chamber and create a vortex flow therewithin. After evaporation, the gas vapor may be removed from the evaporation chamber through a regulating valve to a reaction chamber. Another embodiment of the invention includes a plurality of evaporating domes that separately receive reagent, and may receive reagents of differing composition.

6 Claims, 5 Drawing Sheets

FLASH EVAPORATOR

FIELD OF THE INVENTION

The present invention relates to the field of chemical evaporation, and chemical vapor deposition. More particularly, to a device for flash evaporating a reagent within an evaporation chamber, herewith known as "flash evaporator".

BACKGROUND OF THE INVENTION

In chemical vapor deposition (CVD) and similar processes, it may be advantageous to deliver the precursor reagent into a suitable reaction chamber, in a vapor form. The precursor is evaporated within an independent but adjacent evaporation chamber, and integrally transferred to the reaction chamber by suitable means. Inside the reaction chamber, these vapors are made to further react with heated, or ionized, chemical species and to deposit, or coat, surfaces with a thin layer (Thin Film) of material derived from these reactions. These Thin Films, depending on the nature of the material deposited, have applications in optics (i.e., anti-reflective coatings), electronics (i.e., data storage media), electrooptics (i.e., infrared detectors), mechanical (abrasion resistant coatings), electromechanics (piezoelectric and piezoresistive coatings), a and other general materials research and development areas. Particular examples of materials deposited in Thin Film form by CVD are ferro-electric materials (lead zirconate, barium strontium titanate), high temperature superconductor materials (ytrium-barium-copper oxide), dielectrics (diamond, silicon dioxide), conductors (copper, aluminum).

Among the methods of obtaining a precursor in a vapor form is that of sublimating a solid precursor material. In many instances, however, the sublimation temperature is very close to the decomposition temperature for that material, with the subsequent formation of byproducts in solid form, or which deposit as films of different structure and behavior than the originally sought for.

In other instances in which the precursor is in a liquid form, the vapors are generated by boiling the liquid and/or by passing a carrier gas through it, to carry the vapors down to the reactor. Again problems with prolonged exposure to boiling temperatures, which may be close to the decomposition temperature, arise all too often. Deposition rates are also limited to the vapor carrying capacity of the carrier gas.

A flash evaporator that provides increased temperature stability and control will be less prone to operative failures, and will provide greater consistency of results than known evaporators. Such an evaporator that besides providing a larger range of evaporation rates (thus increasing the film deposition rates), and is easy to maintain and inexpensively repaired, if necessary, will provide additional benefits. It is a purpose of the present invention to provide such an improved evaporator.

U.S. Pat. No. 5,204,314 of Kirlin (1993) provides a method of vaporizing a reagent for CVD reactors. Kirlin provides for a foraminous vaporization structure that may have some utility for the specific compounds disclosed, but is not directly comparable with the present invention. The method of Kirlin does not describe a device (or a method) that provides the advantages of the present invention, as described hereinbelow.

SUMMARY OF THE INVENTION

A device useful for flash evaporation according to the present invention includes a vacuum tight evaporation chamber, an evaporation dome, and feed line(s) and nozzle(s) to deliver a reagent(s) to the evaporation dome. Further, feed lines to supply a heated carrier gas into the evaporation chamber and a feed line to controllably deliver the generated vapors from the evaporation chamber to a reaction chamber are preferably provided.

The above components are adapted to provide temperature control and stability to the evaporation process. Thus the evaporator dome is made of a good thermal conductor, and of sufficient mass to provide temperature stability during evaporation. The dome also includes a heater and two temperature sensors, one int the dome's bulk and one on the dome's external surface, so that the dome may be evenly maintained at a desire temperature. The dome may be of any material that provides these thermal characteristics and is also chemically inert with the reagents and gas vapors used in a specific vaporization process; several metals and metal alloys provide good results. Alternate dome arrangements for different flash evaporation situations are also provided, e.g., for more than one precursor, each at a different evaporation temperature.

The reagent to be vaporized may be introduced onto the evaporator dome in a variety of forms, depending on the specific evaporation rates desired. Using either a set of dropper-like tips, or tips with multiple orifices for the dome(s), the liquid precursor(s) may be delivered as drops, as a continuous stream, or as a shower, or any combination thereof. Further, the distance between a tip and the dome may be varied, allowing a desired amount of heating or cooling to occur to the reagent between its expulsion from the tip and contact with the dome.

The carrier gas is preferably delivered to the evaporation chamber via at least two tubes, the tubes being offset from one another and from the center of the evaporation chamber, so that the carrier gas generates a vortex flow pattern within the chamber. The carrier gas is pre-heated to a temperature suitable with the evaporation of a specific reagent before it is introduced into the chamber.

The reagent is evaporated on the dome's surface to form a vapor, which is evacuated from the evaporation chamber through a suitable evaporation delivery tube. While not necessary to the practice of this invention, the vapor is generally passed into a reaction chamber. The evaporation delivery tube is made of a material that is chemically inert with the vapor, and is thermally insulated to maintain equilibrium temperature with the vapor.

As illustrated in the detailed description below, a preferred embodiment of the device evaporates substantially all of a reagent delivered to an evaporation dome. However, should reagent not filly evaporate, and therefore leave an amount of residue on the chamber, the device is rugged so that it will operate and maintain an established evaporation rate. The device is also easily taken apart and reassembled, for ease of cleaning. This easy disassembly allows for the progress of evaporation of a reagent to be readily observed without interruption.

It will thus be appreciated that a variety of reagents, often called "cocktails", may be evaporated using a device and method according to the present invention. This versatility, as well as ruggedness and ease of cleaning, make the present invention particularly suitable for use in research and development, where numerous cocktails may be evaporated and observed. The present invention may also be useful for the many manufacturing protocols requiring vapor generation, and for other purposes.

DETAILED DESCRIPTION OF THE INVENTION

The present invention provides an evaporator for use with CVD and related operations. A reagent desired to be evaporated is introduced into an evaporation chamber and evaporated on a surface therewithin. The resulting vapor is transported out of the chamber into a reaction chamber or the like, where it may be deposited in a CVD process or otherwise used. The evaporator of the present invention provides "flash evaporation", in that an in volatile reagent may be vaporized sufficiently rapidly so that the stoichiometry of the vapor formed does not substantially vary after evaporation commences. An "in volatile reagent" as used herein refers to a substance that has high vapor pressure at standard temperature and pressure, but may be vaporized at elevated temperatures.

Figure 1:
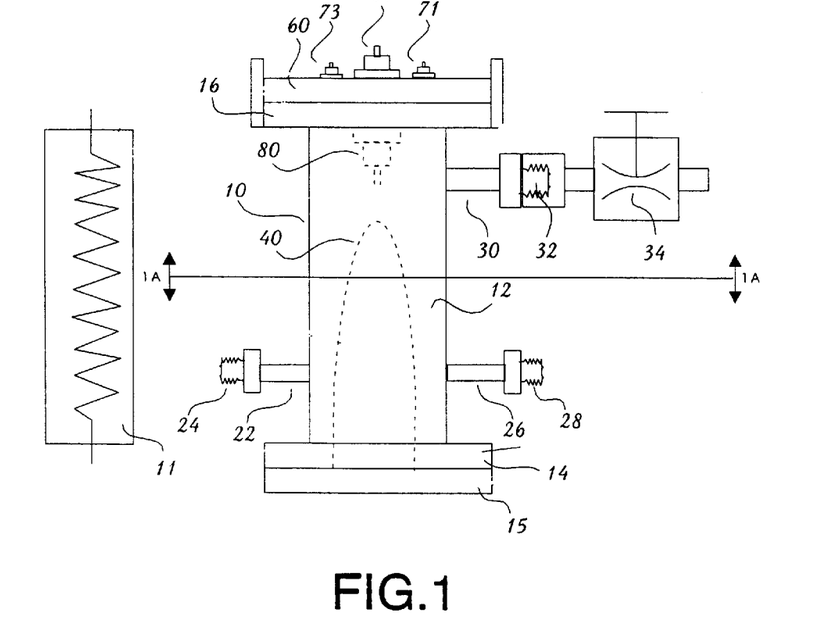
FIG. 1 is a side view of an evaporation chamber according to an embodiment of the present invention, with interior shown in phantom.

Referring to FIG. 1, the present invention includes a preferably cylindrical, evaporation chamber housing 10 enclosing within an evaporation chamber 12. Several criteria are evaluated to select a material for the housing 10. First, the evaporation chamber is made of a material that is selected to be inert to the chemical evaporation process used with the chamber. Obviously, the material must be selected with a specific process in mind, it being well within the skill of the ordinary artisan to select a non-reactive material once a specific reaction is considered. As the present invention provides an evaporator that is potentially useful with a multitude of reagents, it may not be possible to select a housing 10 material that is appropriate with all reactions. A second criterion is that the housing 10 be made of a good thermal conductor. The housing 10 is preferably heated by an enclosing heater 11 (shown schematically) to an even temperature suitable for a specific evaporation process. A uniform, stable temperature, monitored by sensor 9, is maintained at the evaporation chamber wall that is compatible with the specific evaporation process being carried out, so that condensation is avoided. Good thermal conductors, as used herein, include stainless steel, copper, silver, gold, platinum, and others that are suitable with a wide range of reagents and may, along with other materials, provide good results.

The evaporation chamber 12 houses an evaporation dome 40. The evaporation dome has a dome external surface 44E on which a reagent is deposited and flash evaporated. A general dome shape provides good evaporation characteristics in that it allows the reagent to quickly disperse over the area of the dome, and thus be uniformly heated and evaporated. However, other surfaces, such as a flat surface, may provide satisfactory results as well, and are within the scope of the present invention.

The same material selection criteria apply to the dome surface 44E as apply to the housing 10: the dome surface 44E must be non-reactive and of a good thermal conductor material, i.e., stainless steel. Further, the dome 40 must be of sufficient thermal mass (directly related to its size) so that it maintains its temperature after being exposed to a reagent.

The dome 40 is integrally formed with a support base 15 (bottom flange). The support base 15 is preferably detachably attachable to the housing's own support base 14. As may be seen with reference to FIG. 1, the base 14 mates with the housing 10 so that an integral unit results. The base 15 is preferably circular and has diameter somewhat larger than the diameter of the housing 10, but equal to the dome 40, thus adding to the support and physical stability of the overall unit. It should be apparent that the base 14 could have a non-circular shape and still work satisfactorily. It should be apparent that in another version of the dome arrangement, the dome may be made to rotate at a controlled rate of rotation, by means of external rotational devices as known to the art.

The support base 15 must sealingly mate with the other support base 14 to provide an essentially vacuum-tight seal. The vacuum tight seal condition can be obtained by making these bases out of commercially available "conflat flanges", which have a metal gasket in between two knife edges. By tightening a set of outer screws the opposing knife edges bite into the metal gasket and form an efficient vacuum-tight seal, which is at the same time easy to assemble and take apart.

Figure 3:
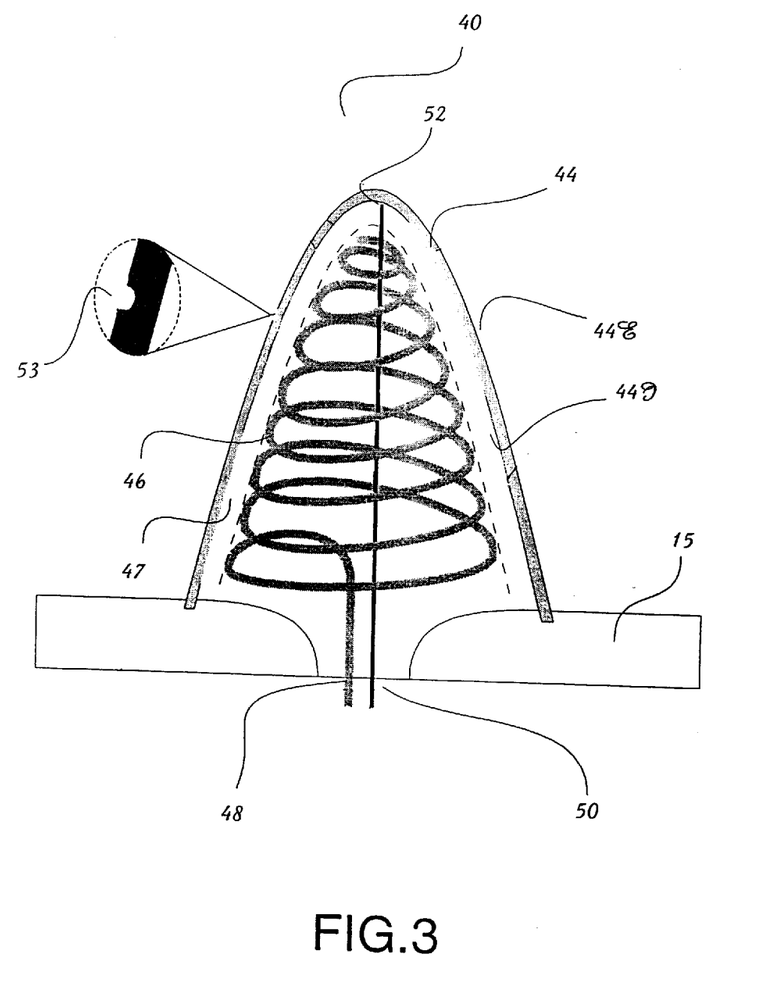
FIG. 3 is a side sectional view of an evaporation dome according to an embodiment of the present invention.

With reference to FIG. 3, the dome surface 44E is preferably heated by a heater 46 contained within a casted metal alloy 47 within the dome 40. A preferred heater 46 is a resistive heater wound in a helical configuration within the metal alloy 47, in the interior dome surface 44I, so that the dome is uniformly heated. This is additionally accomplished by keeping the heating coil a reasonable distance from the dome surface 44 such that there is a substantial layer of casted alloy 47 in between. The casted alloy preferably has a thermal conductivity of about 4 watts $cm^{-1}K^{-1}$, as may be achieved by aluminum alloys. This dome 40, heater and metal alloy 47 configuration is selected in accordance to the maximum temperature requirements for the evaporation process. A resistive heater also allows for precise control of the temperature of the dome surface 44, although other heaters could be used instead. The resistive heater has a connector 48 attached to an electrical power source to power the resistive heating. The dome surface 44 temperature is set for a particular evaporation procedure, as is known in the art.

The temperature of the dome's internal surface 44I is monitored by a temperature sensor 52 located within the dome 40 and in intimate contact with its internal surface 44I. This allows the sensor to most completely reach thermal equilibrium with the dome's internal surface, and thus correctly indicate its temperature. The sensor 52 is attached to means 50 to relay the temperature of the dome's internal surface to a user instrumentation external to the evaporation chamber 12, such as a temperature controller. The dome's external surface preferably has a notch 53 that receives and at least partially encloses an external temperature sensor 53a. This allows the external temperature sensor to most completely reach thermal equilibrium with the dome's external surface, and thus correctly indicate its temperature. Both temperatures of the external and internal dome surfaces 44E and 44I are utilized to precisely control the power to the heating element 46 to match the process requirements.

Figure 2:
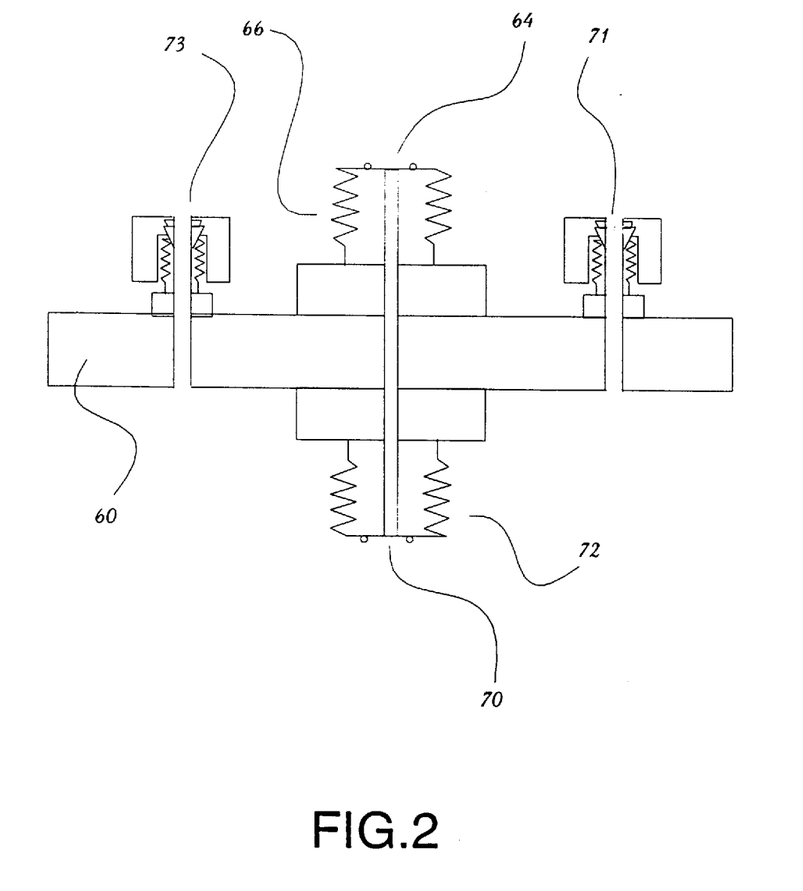
FIG. 2 is a side cross sectional view of an upper flange that seats atop the evaporation chamber and introduces a reagent thereunto, according to an embodiment of the present invention.

With reference to FIG. 2, the reagent is introduced into the evaporation chamber 12 through an inlet 64 formed within a mating flange 60. The mating flange 16 (FIG. 1) constitutes the top of the evaporation chamber 12, and it sealingly engages with the mating flange 60 to complete the entire evaporation chamber. Both mating flanges 16 and 60 are of identical construction as the bottom mating flanges 14 and 15, and also provide a vacuum tight seal environment to the evaporation chamber 12.

A liquid inlet connector 66 is formed into the upper part of the flange 60, the upper part being that which faces away from the chamber 12. The liquid inlet connector 66 accepts a feed line (not shown) for supplying reagent to be flash evaporated. The reagent may be propelled through the feed line by a fluid pump, as are commercially available. The inlet connector 66 may be threaded to accept a correspondingly threaded feed line, or other connector systems may be used. An inlet 64 allows fluid flow into and through the flange 60, to a liquid outlet 70 formed int the bottom of the flange 60. The liquid outlet 70 exits the bottom of the flange 60 at a nozzle support 72.

Figure 4:
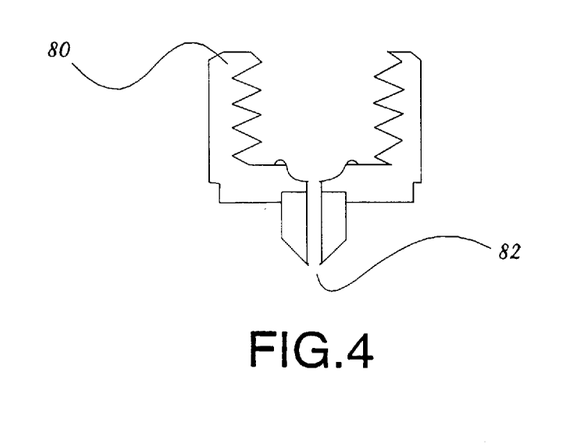
FIGS. 4 and 4A show side sectional views of different embodiments of nozzles to introduce a reagent into the evaporation chamber.

The nozzle support 72 supports a nozzle 80 through which a reagent flows (see FIG. 4). After flow through the nozzle 80, the reagent falls beneath the nozzle onto the evaporator dome external surface 44E. It is the purpose of the nozzle to direct the flow of the reagent at a desired rate. The nozzle 80 has a tip 82 that permits a drop by drop, or an essentially continuous flow through the tip and thus onto the dome's surface 44E. The tip 82 is essentially a continuation of the inlet 64, so that reagent will flow through the tip 82 at the same rate that it enters the inlet 64. Assuming the reagent flows through the feed line continuously, a continuous flow will exit the nozzle tip 82.

The nozzle 80 may be used to provide the reagent as a series of drops, by pulsing the flow through the feed line. It may be desirable to introduce the reagent to the dome surface 44E as a series of drops, so that each drop is evaporated before the next drop contacts the dome surface 44E. This insures that the dome 40 does not become overly saturated with reagent, which could then collect on the dome faster than the dome could vaporize the liquid. Whether this would occur depends upon the reagent and the rate of continuous flow, and the thermal recovery of the dome. It is advantageous to be able to supply the reagent as either drops or a continuous flow depending on the application.

The flow through the nozzle 80 may be conditioned to provide drop flow without pulsing the flow of reagent through the feed line. This is done by reducing the pumping action of the liquid pump assigned to that particular line, such that the low flow of the liquid through the nozzle 80 will allow to collect itself at the tip 82 and eventually fall as a drop onto the dome surface 44E. The optimum drop rate will depend on the liquid's evaporation rate while the drop is forming, and is that one which does not permit the formation of solids within the drop and allows for thermal recovery of the dome surface 44E, as is known in the art of fluid tips.

Figure 4A:
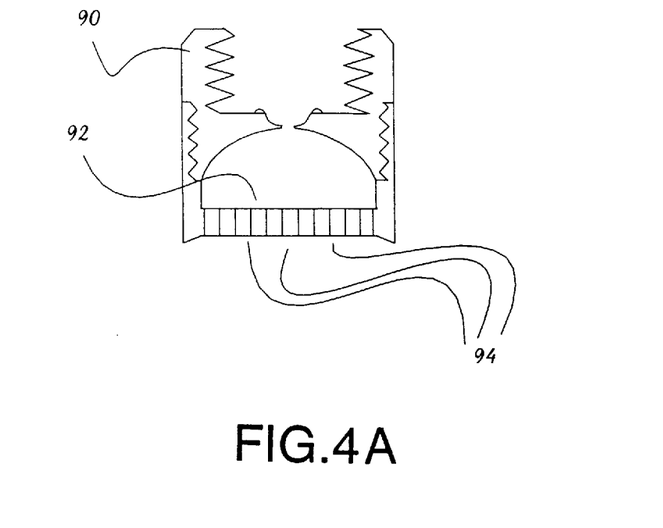

Another alternative nozzle 90 is depicted in FIG. 4A. The nozzle 90 provides a shower effect, to direct a plurality of fluid streams onto the dome surface 44E. A nozzle tip 92 is a primarily solid surface located at the lower end of the nozzle 90. A multiplicity of through-holes 94 are formed within the tip 92, and provide the shower effect. When fluid is directed into the nozzle 90, the fluid will strike the tip 92, and swirl around inside the head before flowing through one of the multiplicity of through-holes 94. Turbulence into the flow will cause the reagent to flow through the holes more or less randomly, so that a shower effect is created. The shower flow may be advantageous for vaporizing a relatively large quantity of reagent, in that it supplies the reagent more rapidly than would a continuous flow through a single opening tip, and still allows for thermal recovery of the dome surface 44E. This increases the evaporative capacity of the dome, and reduces local heat fluctuations that may occur in the dome 44.

Another feature of the nozzle of the present invention, regardless of the embodiment, is that the distance between the nozzle and the dome 40 may be varied. This feature can be accomplished in several ways. One method, described in connection with the nozzle 80 is to simply lengthen the nozzle tip 82. By placing a longer or shorter tip nozzle, the user can vary the distance the reagent will travel from the nozzle tip 82 to the dome 40. Varying this distance is useful because it may be desirable to provide a relatively long distance to allow the reagent to warm int the evaporation chamber 12 before striking the dome surface 44E. However, depending on the reagent, it may be desirable to limit the distance to insure that the reagent does not partially decompose before striking the dome 40.

Another attribute preferably shared by all nozzles of the present invention is that the nozzle will have sufficient wall thickness to allow for a thermal gradient to develop across. This has the effect of preventing premature evaporation or decomposition of the reagent, and at the same time, it will allow for the reagent to warm up enough to reduce the energy requirements to maintain the dome surface 44E at the required temperature, and may provide more efficient and complete vaporization. The nozzle should be constructed of a material non-reactive with the reagent, such as many of the metals described above.

Yet another nozzle embodiment is an atomizing nozzle that can deliver the reagent to the dome surface 44E in a fine, spray manner. Such an atomizer would simply require substituting the nozzle 80 with an atomizing tip nozzle, as is known in the art. A fine spray may provide advantages similar to the shower nozzle tip 92, in that the spray deposits the reagent over a larger surface area of the dome 40 than does a single stream, and may therefore be more evenly heated by reducing localized temperature variations to the dome surface 44E.

Preferably, the flange 60 includes a temperature sensor inlet 73 that is in gaseous communication with the chamber 12. The inlet 73 may simply be a through-hole through flange 60. The inlet receives a temperature sensor (not shown) that senses the temperature of the external surface of the evaporating dome 40 at the notch 53. Means are provided for indicating the output of the temperature sensor to a user external to the chamber 12.

Preferably, the flange 60 includes a temperature sensor inlet 71 that is in gaseous communication with the chamber 12. The inlet 71 may simply be a through-hole through the flange 60. The inlet receives a temperature sensor (not shown), that senses the temperature of the vapors leaving the evaporation chamber 12, through exit orifice 32. Means are provided for indicating the output of the temperature sensor to a user external to the chamber 12.

The present invention includes means for introducing a carrier gas into the evaporation chamber 12. Preferably, two carrier gas tubes 22 and 26 provide for the gaseous communication with the evaporation chamber 12. The tubes preferably include couplings 24 and 28 for receiving carrier gas feed lines. The couplings 24 and 28 are depicted as threaded connectors; other connectors may also achieve good results provided that they sealingly engage with the carrier gas feed lines.

Figure 1A:
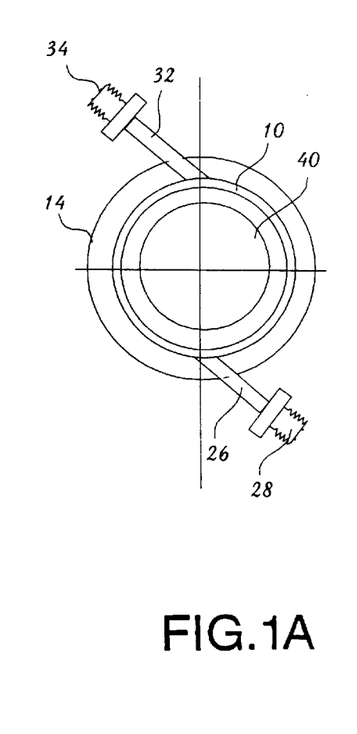
FIG. 1A is a cross sectional plan view taken along the line 1A—1A, and looking down towards the base of the evaporation chamber, according to an embodiment of the present invention.

Referring to FIG. 1A, the carrier gas tubes 22 and 26 are offset from the axis of the evaporation chamber 12, and are offset from one another. Thus, carrier gas introduced into the tubes results in a tangential, vortex flow around the axis of the evaporation chamber 12. The carrier gas tubes 22 and 26 preferably enter the evaporation c chamber 12 through the lower portion of the sidewall 10 (housing). While the exact location of the tubes 22 and 26 may not be critical, the tubes should be lower than the dome surface 44 that receives the reagent to be evaporated (i.e., the top of the dome surface 44). It should be appreciated that the carrier gas tubes 22 and 26 are not essential aspects of the invention, and that flash evaporation may be performed int the absence of a carrier gas; however, many evaporation processes either require or benefit from a carrier gas. If a carrier gas is used, the carrier gas is preferably pre-heated to a temperature suitable with the evaporation process. This may be accomplished with the heater 11 before the carrier gas is introduced into the chamber 12. The means to accomplish this are not part of this invention, and are well know to practitioners of the art.

Figure 1B:
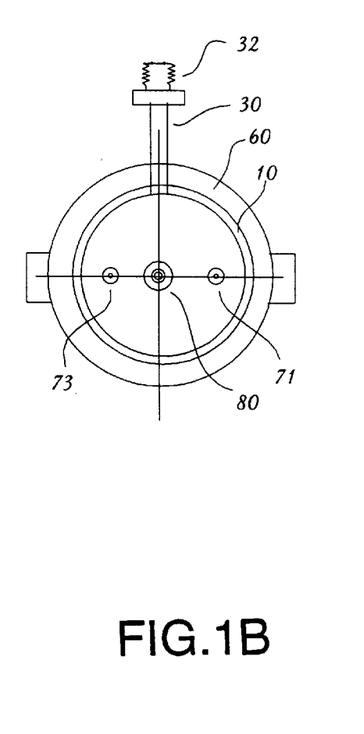
FIG. 1B is a cross sectional plan view taken along the line 1B—1B, and looking up towards the tope of the evaporation chamber, according to an embodiment of the present invention.

Referring to FIG. 1, and FIG. 1B, vapor removal tube 30 is provided to remove the generated vapors from the evaporation chamber 12. Preferably, the tube 30 is located relatively high on the evaporation chamber sidewall 10 (housing), above the top of the evaporation dome 40. The tube 30 has a coupler 32 to accept a feed line leading to a desired reaction chamber, wherein the generated vapors are used as desired. A valve 34 located between the evaporation chamber 12 and the desired reaction chamber, allows control of the rate of vapor flow into the reaction chamber. Typically, the valve 34 may be closed until the evaporation of the reagent commences, at which point the valve 34 is opened to allow a desired vapor flow rate. The temperature of the vapor is monitored with a temperature sensor, introduced into the evaporation chamber 12, via a sensor inlet 71 or 73, as described earlier. Additionally, other type of vapor gas flow controllers may be utilized, as is known to practitioners of the art. Both the vapor removal tube 30 and the valve 34 are made of material that is non-reactive with the generated vapor, as described in connection with other parts of the present invention.

Figure 5:
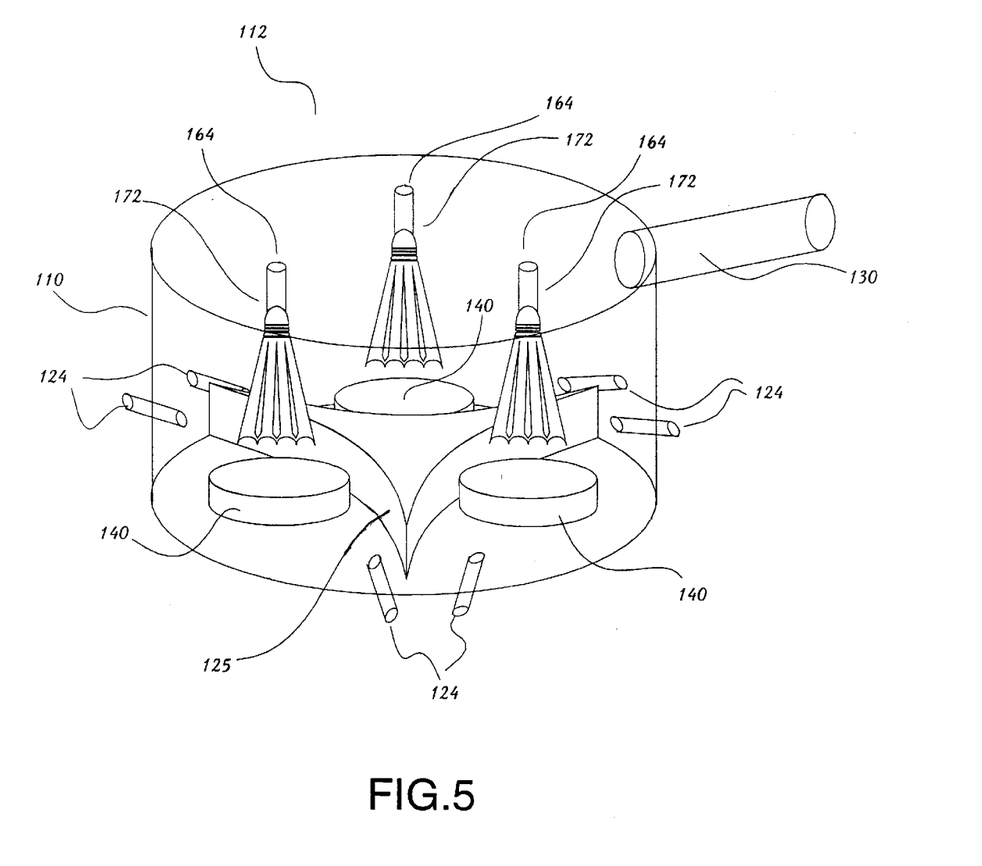
FIG. 5 depicts a perspective schematic view of an embodiment of the invention including a plurality of evaporation domes.

Referring to FIG. 5, another embodiment of the present invention provides a multiplicity of evaporation domes or surfaces 140. The embodiment of FIG. 5 shows three such evaporation domes 140, but it should be appreciated that more or fewer could be used instead. The evaporation dome 140 are housed within an evaporation chamber 112 formed of a sidewall 110. Each evaporation dome has reagent separately supplied to it, by an inlet 164 and associated nozzles 172, similar to the inlet 64 and nozzle 70 described above.

The separate domes allow for separate reagents to be simultaneously vaporized at different, or similar, evaporation temperatures, and thus for the generation of vapors having mixtures of the separate reagents. This is accomplished by having each dome in independent electrical communication with an individually attached temperature and power control system (designated with reference character S in FIG. 5). In addition, a splash shield 125 reduces the possibility of liquid precursor cross contamination from one evaporating dome to the other, at different evaporating temperature. This may be desirable both for research purposes and for manufacturing protocols.

The operation of the invention may now be described. A user establishes a reagent, or reagents (often termed a precursor) that the user wishes to vaporize. The precursor may be stored in any suitable vessel. A feed line is placed in fluid communication with the fluid inlet 64, the feed line being selected to couple with the connector 66. The fluid is pumped through the feed line, and thus through the inlet 64 and through the nozzle 80, out of the nozzle tip 82, and onto the evaporator dome surface 44.

Before delivery of the reagent onto the evaporator dome surface 44, the power to the dome heater 46 is applied in conjunction with the dome temperature sensor 52 until the dome 40 is heated to the desired temperature for a specific reagent, namely, the temperature at which the reagent vaporizes. The chamber sidewall 10 is now preheated to a temperature commensurate with the evaporation temperature of the specific reagent in use. This is accomplished by activating the enclosing heater 11 and monitoring the chamber temperature via the temperature sensor through point 71, until the desired temperature is achieved. The temperature is selected so that condensation will not collect on the chamber sidewalls.

If a carrier gas is used, the carrier gas is delivered through the carrier gas tubes 24 and 26, at a given flow rate specific to the process, to provide a vortex carrier gas flow through the chamber 12. The carrier gas is preferably heated using external means to the chamber 12. This can be achieved by the use of an in-line gas heater as those commercially available to the trade.

The temperature of the housing 10 and dome 40 is thus suitably raised before the reagent is applied to the dome 40. The reagent flows onto the dome surface 44E and is immediately thereafter evaporated. The generated vapor occupies the chamber 12, and is evacuated through the vapor removal tube 30. In general, the vapor removal tube 30 will be in gaseous communication with a reaction chamber via a control valve 34, and thus the vapor is supplied to the reaction chamber at a specific flow rate. However, the present invention does not require such a reaction chamber to be utilized. The control valve 34 is preferably closed until the reagent is first reacted with the dome surface 44, and thereafter opened to a position to supply the gas vapor at a desired flow rate.

Evaporation may be continuously performed, by continuously supplying a reagent through the nozzle 82 and maintaining the temperatures of the housing 10 and dome 40.

The operation of the alternative nozzle 90, or an atomizing sprayer, is essentially the same as described above. The reagent is supplied through the nozzle 90, or atomizer, and deposited onto the dome surface 44. The same operating conditions as described above are used. Similarly, the multiple evaporating dome 140 embodiment described in connection with FIG. 5. Reagent is supplied to each dome 140 through as associated inlet 164, and the separate reagents are simultaneously vaporized.

The invention is designed to operate continuously and ruggedly. However, it may be necessary from time to time to clean the chamber 12 and the parts used therein. This may be done by removing the upper flange 60 and lower flange 15 from the mating flanges 16 and 14 respectively, from the housing 10, thereby exposing the chamber 12. The chamber interior can thus be cleaned, and the upper and lower flanges 60 and 15 replaced, so that the chamber 12 is again prepared for evaporation.

The evaporation dome 40 and the nozzle arrangement may also require occasional cleaning, as may the other described parts. The dome 40 and nozzle 80 may be cleaned by removing the dome base plate or lower flange 15 and the upper flange 60, from the housing 10, as described above.

What is claimed is:

1. A device for flash evaporating a reagent, comprising:
   a housing partially defining an evaporation chamber therewithin;
   an evaporation dome insertable within said chamber, the dome having a substantially solid outer surface and an inner surface, the dome being of a good thermal conduction material;
   an internal heater disposed within said evaporation dome for heating said evaporation dome;
   an upper flange disposed on said housing, said upper flange defining an upper chamber boundary of the evaporation chamber;
   a nozzle in fluid communication with said fluid inlet for applying a reagent to said evaporation dome outer surface;
   a vapor removal tube in fluid communication with said chamber;
   a valve for regulating flow through said vapor removal tube; and
   at least a pair of carrier gas supply tubes in gaseous communication with said chamber, the gas supply tubes being offset from one another and the housing to provide a vortex flow of carrier gas within said chamber.

2. A device for flash evaporating a reagent, comprising:
   a housing partially defining an evaporation chamber therewithin;
   an evaporation dome insertable within said chamber, the dome having a substantially solid outer surface and an inner surface, the dome being of a good thermal conduction material;
   an internal heater disposed within said evaporation dome for heating said evaporation dome;
   an upper flange disposed on said housing, said upper flange defining an upper chamber boundary of the evaporation chamber;
   a nozzle in fluid communication with said fluid inlet for applying a reagent to said evaporation dome outer surface;
   a vapor removal tube in fluid communication with said chamber;
   a valve for regulating flow through said vapor removal tube; and
   wherein said nozzle has a plurality of orifices to provide a plurality of streams of reagent.

3. A device for flash evaporating a reagent, comprising:
   a housing partially defining an evaporation chamber therewithin;
   an evaporation dome insertable within said chamber, the dome having a substantially solid outer surface and an inner surface, the dome being of a good thermal conduction material;
   an internal heater disposed within said evaporation dome for heating said evaporation dome;
   an upper flange disposed on said housing, said upper flange defining an upper chamber boundary of the evaporation chamber;
   a nozzle in fluid communication with said fluid inlet for applying a reagent to said evaporation dome outer surface;
   a vapor removal tube in fluid communication with said chamber;
   a valve for regulating flow through said vapor removal tube; and
   at least one other inlet for receiving fluid in said upper flange; at least one other nozzle in fluid communication with said one other inlet; and at least one other dome for evaporating reagent supplied through said one other nozzle.

4. The device of claim 3, wherein said at least one other additional nozzle is in independent fluid communication with individually attached liquid delivery systems.

5. The device of claim 3, wherein said at least one other evaporation dome is in electrical communication with an individually attached temperature and power control system.

6. The device of claim 3 further comprising splash shield to prevent cross contamination of said at least one other evaporation dome.

* * * * *